(12) United States Patent
Yang et al.

(10) Patent No.: US 7,563,652 B2
(45) Date of Patent: Jul. 21, 2009

(54) METHOD FOR ENCAPSULATING SENSOR CHIPS

(75) Inventors: Kuo-Pin Yang, Kaohsiung County (TW); Wei-Min Hsiao, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 396 days.

(21) Appl. No.: 11/617,195

(22) Filed: Dec. 28, 2006

(65) Prior Publication Data

US 2008/0009102 A1 Jan. 10, 2008

(30) Foreign Application Priority Data

Jul. 7, 2006 (TW) ............... 95124955 A

(51) Int. Cl.
*H01L 21/44* (2006.01)
*H01L 21/48* (2006.01)

(52) U.S. Cl. .................. 438/126; 438/127; 438/26; 438/64; 438/113; 257/787; 257/434; 257/E21.499

(58) Field of Classification Search ............... 438/126, 438/127, 26, 64, 113; 257/787, 434, E21.499
See application file for complete search history.

(56) References Cited

U.S. PATENT DOCUMENTS

| | | | | |
|---|---|---|---|---|
| 6,528,351 | B1 * | 3/2003 | Nathan et al. ............... | 438/118 |
| 6,576,998 | B1 * | 6/2003 | Hoffman .................... | 257/724 |
| 7,015,579 | B2 * | 3/2006 | Okada et al. ................ | 257/738 |
| 7,071,016 | B2 * | 7/2006 | Park et al. ................... | 438/48 |
| 2001/0004128 | A1 * | 6/2001 | Park et al. ................... | 257/680 |
| 2005/0112805 | A1 * | 5/2005 | Goto et al. ................... | 438/149 |
| 2006/0054913 | A1 * | 3/2006 | Hadame et al. ............... | 257/99 |

* cited by examiner

*Primary Examiner*—Nitin Parekh
(74) *Attorney, Agent, or Firm*—Thomas, Kayden, Horstemeyer & Risley

(57) ABSTRACT

A method for encapsulating sensor chips is disclosed. A protective layer is formed on an active surface of a sensor chip, and at least covers a sensor region in the active surface. The active surface of the sensor chip faces to a temporary carrier, so that the protective layer is attached to the temporary carrier. An encapsulant is formed on the temporary carrier to cover a back surface and side surfaces of the sensor chip. A plurality of electrically connecting components are formed in the encapsulant to electrically connect a plurality of bonding pads of the sensor chip, and then the protective layer is removed to expose the sensor region. The coverage of the protective layer is used to avoid pollution on the sensor region during encapsulating, thereby, especially in a wafer level packaging, making the package profile neat, tidy and smaller in size, and promoting production efficiency.

14 Claims, 5 Drawing Sheets

METHOD FOR ENCAPSULATING SENSOR CHIPS

RELATED APPLICATIONS

The present application is based on, and claims priority from, Taiwan Application Serial Number 95124955, filed Jul. 7, 2006, the disclosure of which is hereby incorporated by reference herein in its entirety.

FIELD OF THE INVENTION

The present invention relates to a method for encapsulating sensor chips, and more particularly, to an encapsulating method for locally covering a back surface and side surfaces of a sensor chip.

BACKGROUND OF THE INVENTION

In the package structure of a sensor chip, a sensor region in the sensor chip is extremely sensitive, and thus before packaging the sensor chip, a transparent plate is formed above the sensor region for preventing the sensor region from being polluted or damaged during a packaging process.

Such as shown in FIG. 1, a conventional image-sensor chip package structure 100 includes a substrate 110, an image sensor chip 120, a transparent plate 130, a plurality of electrically connecting components 140 and an encapsulant 150. The substrate 110 has a top surface 111 and a plurality of connecting pads 112. The image sensor chip 120 has an active surface 121, and the active surface 121 has a plurality of bonding pads 122 formed thereon and includes a sensor region 123. A conventional die-bonding technique is applied to dispose the image sensor chip 120 on the top surface 111 of the substrate 110. The transparent plate 130 is attached to active surface 121 of the imager sensor chip 120 in advance, and is used to cove the sensor region 123 of the imager sensor chip 120 for preventing the sensor region 123 from being polluted during the packaging process. In general, the transparent plate 130 does not cover the bonding pads 122 of the image sensor chip 120, thereby benefiting the electrically connecting components 140 to connect the bonding pads 12 of the image sensor chip 120 to the connecting pads 112 of the substrate 110, wherein the electrically connecting components 140 are bonding wires in the form of wire-bonding. The encapsulant 150 is dotted on the top surface 111 of the substrate 110 for sealing the electrically connecting components 140, the bonding pads 122 and the connecting pads 11.

Since the image sensor chip 120 is attached to the substrate 110 and the electrically connecting components 120 are used to connect the image sensor chip 120 to the substrate 110, the size of the conventional image-sensor chip package structure 100 can be reduced, and meanwhile, the fabrication cost thereof is increased due to the transparent plate 130 disposed on the image sensor chip 120.

SUMMARY OF THE INVENTION

One main aspect of the present invention is to provide a method for encapsulating sensor chips, wherein a protective layer is formed on an active surface of a sensor chip, and at least covers a sensor region in the active surface, and the active surface of the sensor chip faces to a temporary carrier, and is attached to the temporary carrier via the protective layer; and an encapsulant is formed on the temporary carrier to cover the sensor chip locally, wherein the protective layer and temporary carrier are removable. Since the sensor region of the sensor chip is covered by the protective layer during process, the sensor region can be protected from being polluted, thereby making the package profile neat, tidy and smaller in size, and having the efficacy of promoting production efficiency.

According to the method of the present invention for encapsulating sensor chips, a sensor chip is first provided, the sensor chip having an active surface, a back surface opposite to the active surface, and a plurality of side surfaces defined between the active surface and the back surface, wherein the active surface has a plurality of bonding pads formed thereon and includes a sensor region. Then, a protective layer is formed on the active surface of the sensor chip, wherein the protective layer at least covers the sensor region. Thereafter, the sensor chip is attached to a temporary carrier, wherein the active surface of the sensor chip faces to the temporary carrier, and is attached to the temporary carrier via the protective layer, and an encapsulant is formed on the temporary carrier, wherein the encapsulant covers the back surface and the side surfaces of the sensor chip. Then, the temporary carrier is removed. Thereafter, a plurality of electrically connecting components is formed in the encapsulant, and are electrically connected to the bonding pads of the sensor chip, and then the protective layer is removed to expose the sensor region.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 1:
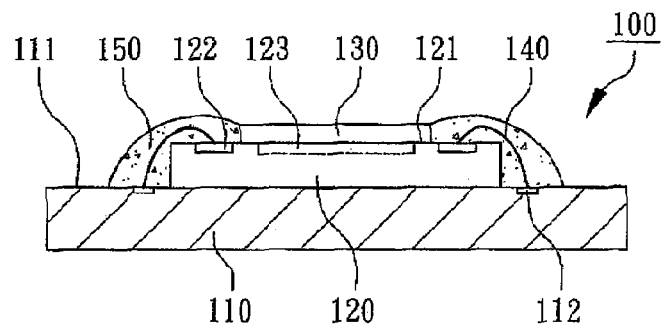
FIG. 1 is a schematic cross-sectional view showing the package structure of a conventional image sensor.
Figure 2A:
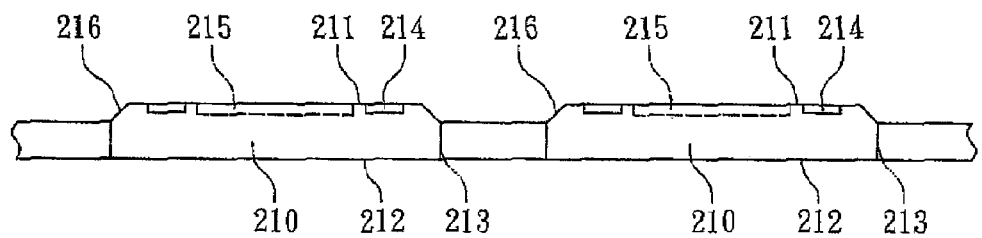
FIG. 2A to FIG. 2M are schematic cross-sectional views showing the process for encapsulating a sensor chip according to an embodiment of the present invention.
Figure 2B:
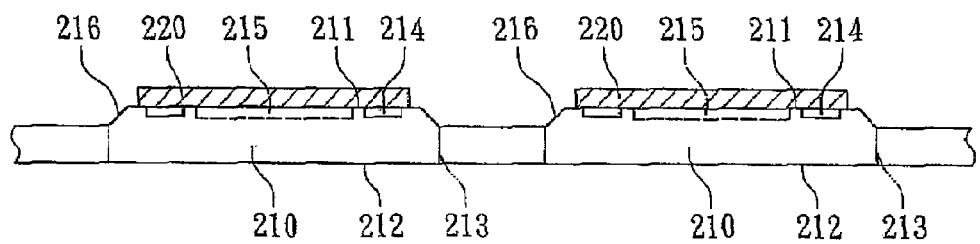

The present invention discloses a method for encapsulating sensor chips. At first, such as shown in FIG. 2A, at least one sensor chip 210 is monolithically formed in an uncut wafer, and can be a CMOS image sensor chip having an active surface 211, a back surface 212 opposite thereto, and a plurality of side surfaces 213 are defined between the active surface 211 and the back surface 212, wherein the active surface 211 has a plurality of bonding pads 214 formed thereon and includes a sensor region 215. Preferably, there are chamfered corners formed on the periphery of the active surface 211 of the sensor chip 210 for preventing stress concentration causing the break of the sensor chip 210 from occurring during an encapsulating process. Thereafter, such as shown in FIG. 2B, a protective layer 220 is formed on the active surface 211 of the sensor chip 210, wherein the protective layer 220 at least covers the sensor region 215 of the sensor chip 210, and preferably covers the bonding pads 214. The protective layer 220 is made of an easily removable material, such as photoresist material or thermomelt adhesive, for temporarily protecting the sensor region 215 during the processes of encapsulating and electrically connecting. In the present embodiment, the protective layer 220 is a photosensitive dry film, and can be made of epoxy resin, acrylic resin and polyimide. The protective layer 220 can be washed out via mild developing solvent after irradiation, and thus can be easily removed without resulting in pollution and damage to the sensor region 215 of the sensor chip 210. However, in an alternative embodiment, when the protective layer 220 is made of transparent material, it can be retained for directly protecting the sensor region 215.

Figure 2C:
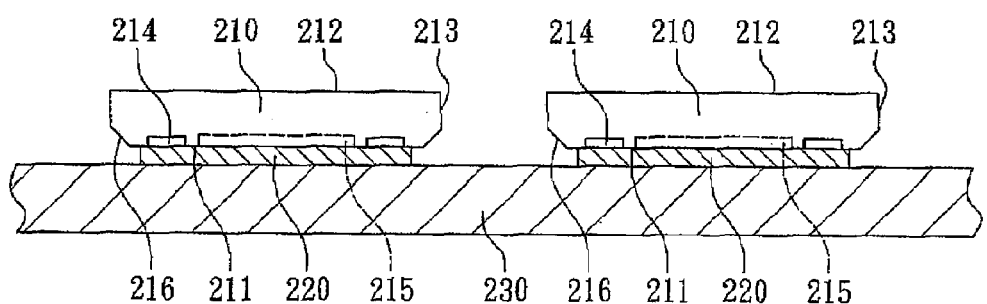

Thereafter, such as shown in FIG. 2C, the sensor chip 210 is attached to a temporary carrier 230, wherein the active surface 211 of the sensor chip 210 faces to the temporary carrier 230, and is attached to the temporary carrier 230 via the protective layer 220. In the present embodiment, the temporary carrier 230 is a UV (Ultraviolet) tape, which has the characteristic of losing adhesiveness after being irradiated by UV light, and thus is easily to be removed. Hence, the temporarily carrier 230 does not need to be attached to the sensor chip 210 directly, i.e. having the efficacy of fixing the sensor chip 210 and protecting the sensor region 215 from being polluted. Further, in the present embodiment, before the sensor chip 210 is attached to the temporary carrier 230, the sensor chip 210 is monolithically formed in a wafer. Thus, after the sensor chip 210 is attached to the temporary carrier 230, a wafer-cutting step has to be performed for separating the sensor chip 210 individually so as to expose the side surfaces 213.

Figure 2D:
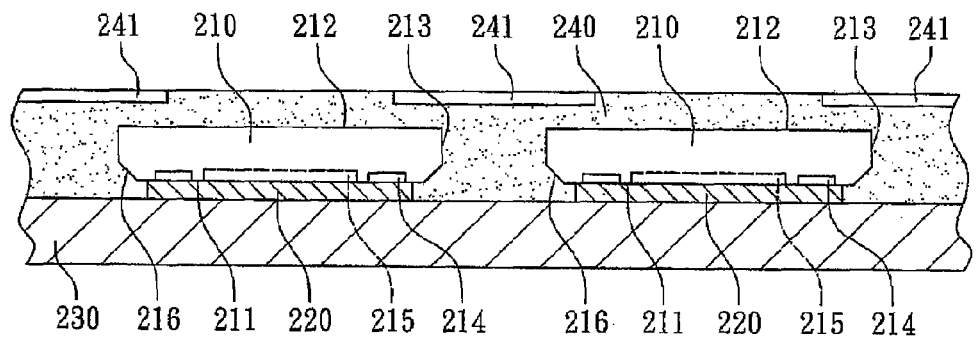
Figure 2E:
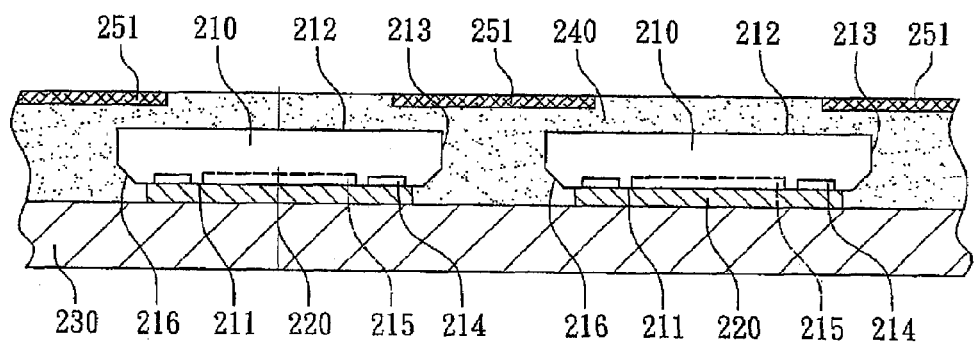
Figure 2F:
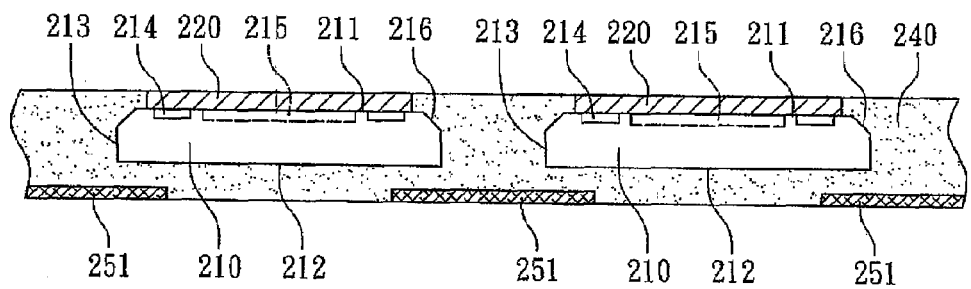
Figure 2G:
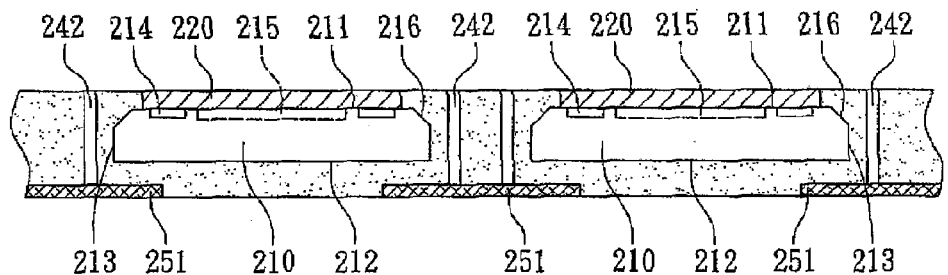
Figure 2H:
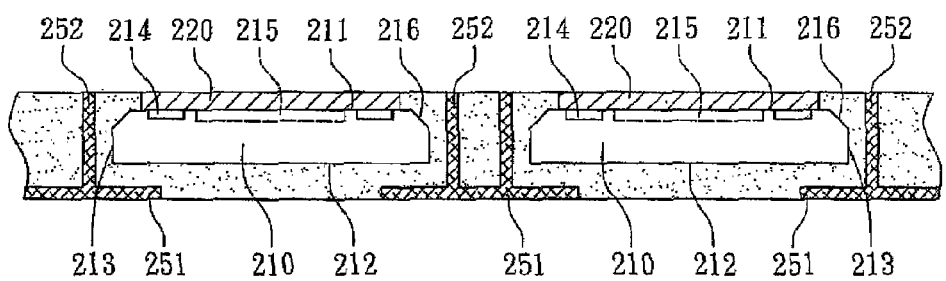
Figure 2I:
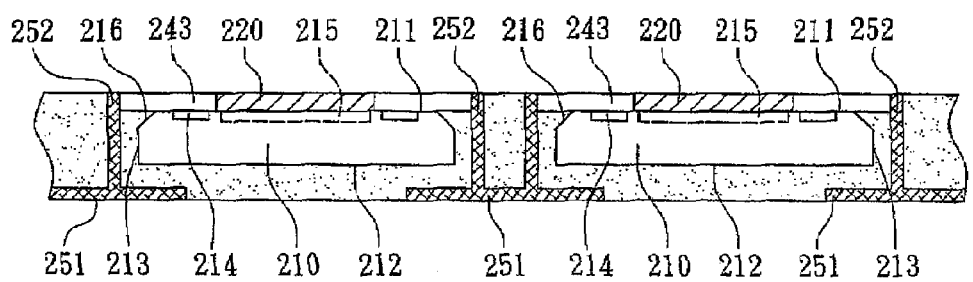
Figure 2J:
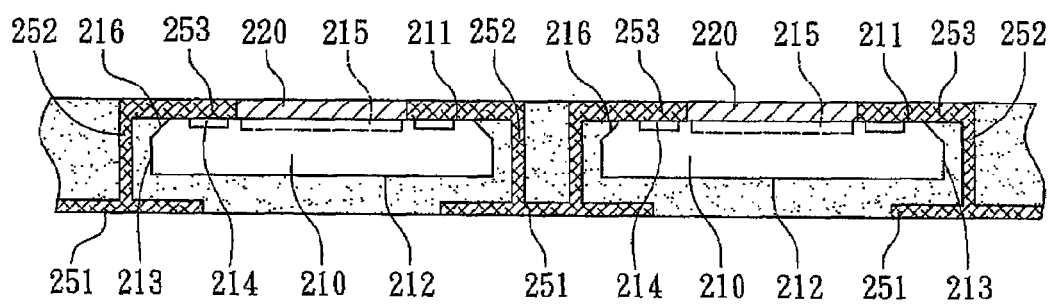

Thereafter, such as shown in FIG. 2D, a pres molding technique is used to form an encapsulant 240 on the temporary carrier 230, wherein the encapsulant 240 covers the back surface 212 and the side surfaces 213 of the sensor chip 210. Preferably, while the encapsulant 240 is formed, a specific mold design can be used to make the encapsulant 240 have a plurality of finger grooves 241. Then, such as shown in FIG. 2E, the finger grooves 214 can be filled with or electroplated with the conductive metals such as copper, nickel, gold and aluminum, thereby forming a plurality of first electrically connecting components 251. Thereafter, such as shown in FIG. 2F, the temporary carrier 230 is removed. Then, such as shown in FIG. 2G, a plurality of through holes 242 are formed in the encapsulant 240 by laser drilling, and are linked to the first electrically connecting components 251. Thereafter, such as shown in FIG. 2H, the through holes 242 can be filled with or electroplated with the conductive metals such as copper, nickel, gold and aluminum, thereby forming a plurality of second electrically connecting components 252 in the through holes 242 of the encapsulant 240, wherein the second electrically connecting components 252 are connected to the first electrically connecting components 251 respectively. Thereafter, such as shown in FIG. 2I, a plurality of trenches 243 are formed by the methods such as laser, etc., and are formed in the encapsulant 240 above the active surface 211 of the sensor chip 210, the trenches 243 extending to the bonding pads 214 of the sensor chip 210 from the second electrically connecting components 252. Then, such as shown in FIG. 2J, the trenches 243 can be filled with or electroplated with the conductive metals such as copper, nickel, gold and aluminum, thereby forming a plurality of third electrically connecting components 253 in the trenches 243, wherein the third electrically connecting components 253 are connected to the second electrically connecting components 252 and the bonding pads 214 respectively, and can be in a wire form or a pin form.

Figure 2K:
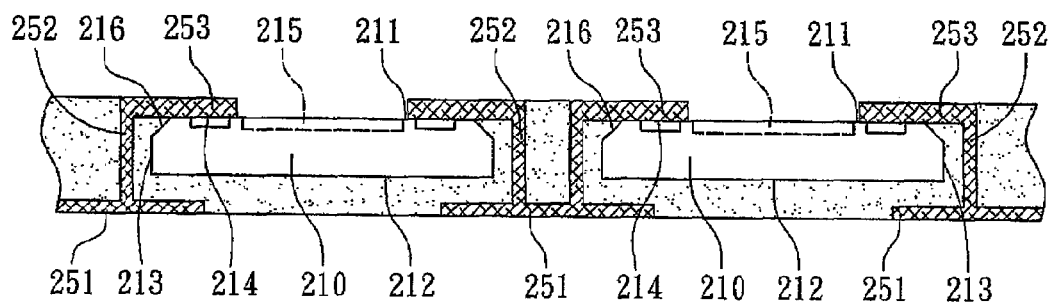

Thereafter, such as shown in FIG. 2K, if necessary, photoresist stripper or proper enchant can be used to remove the protective layer 220 for exposing the sensor region 215. Hence, during the encapsulating process, by means of the protective layer 220 covering the sensor region 215, the sensor region 215 can be protected from pollution.

Figure 2L:
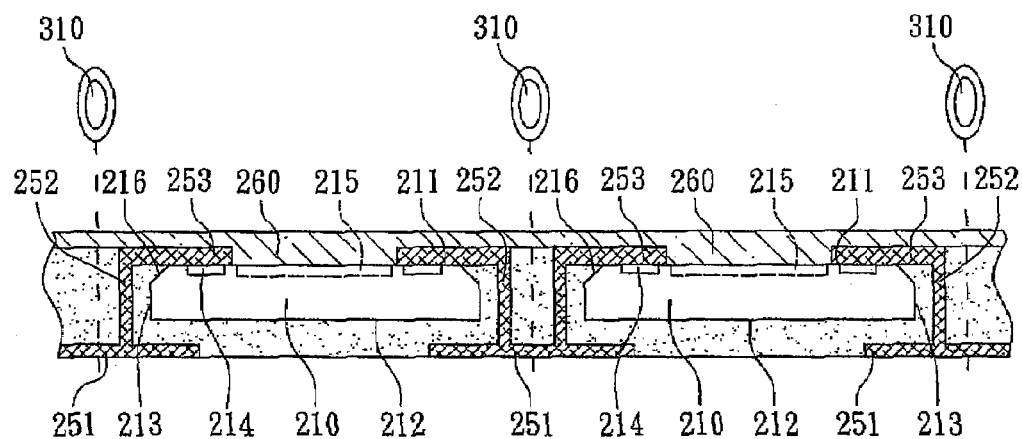
Figure 2M:
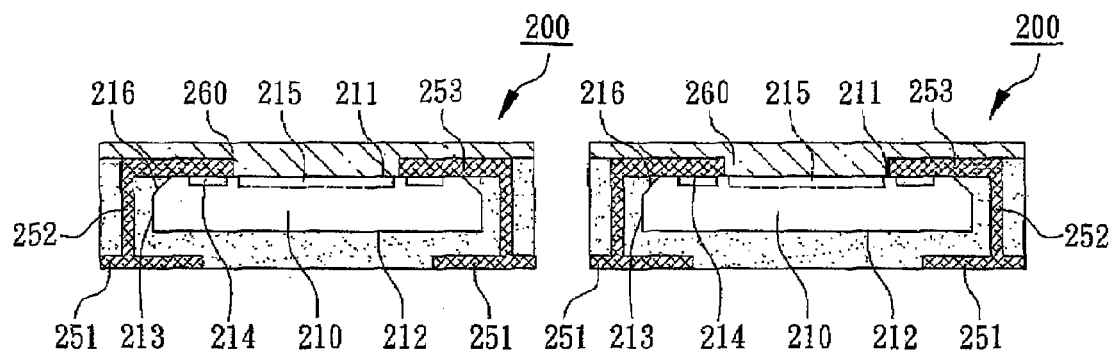

Then, such as shown in FIG. 2L, after the protective layer 220 is removed, a transparent passivation layer 260 is formed on the active surface 211 of the sensor chip 210, and further covers the encapsulant 240, thereby protecting the sensor region 215 and the third electrically connecting components 253. Then, such as shown in FIG. 2L, a cutting tool 310 can be applied to cut out the encapsulant 240 so as to individually separating a plurality of image-sensor chip package structures 200 which have been encapsulated and completed with electrical connections, such as shown in FIG. 2M.

Hence, the method of the present invention for encapsulating sensor chips is particularly suitable for use in wafer level packaging, wherein the coverage of the protective layer 220, during the manufacturing process, is used to avoid pollution on the sensor region 215 during encapsulating, and thus the package profile becomes neat, tidy and smaller in size, and production efficiency is promoted.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for encapsulating sensor chips, comprising steps of:
   providing a sensor chip having an active surface, a back surface opposite to the active surface, and a plurality of side surfaces defined between the active surface and the back surface, wherein the active surface has a plurality of bonding pads formed thereon and includes a sensor region;
   forming a protective layer on the active surface of the sensor chip, wherein the protective layer at least covers the sensor region;
   attaching the sensor chip to a temporary carrier, wherein the active surface of the sensor chip faces to the temporary carrier, and is attached to the temporary carrier via the protective layer;
   forming an encapsulant on the temporary carrier, wherein the encapsulant covers the back surface and the side surfaces of the sensor chip;
   removing the temporary carrier; and
   forming a plurality of electrically connecting components in the encapsulant, wherein the electrically connecting components are electrically connected to the bonding pads of the sensor chip.

2. The method of claim 1, wherein the sensor chip is a CMOS image sensor chip.

3. The method of claim 1, further comprising:
   removing the protective layer to expose the sensor region.

4. The method of claim 3, wherein the protective layer is a photosensitive dry film.

5. The method of claim 3, further comprising:
   forming a transparent passivation layer on the active surface of the sensor chip after the protective layer is removed, for protecting the sensor region and the electrically connecting components.

6. The method of claim 1, wherein the encapsulant has a plurality of finger grooves provided for forming electrically conductive metal.

7. The method of claim 6, wherein the step of forming the electrically conductive metal comprises an electroplating method.

8. The method of claim 1, wherein the step of forming the electrically connecting components further comprises:
   forming a plurality of through holes in the encapsulant; and
   forming an electrically conductive metal in the through holes.

9. The method of claim 8, wherein the step of forming the electrically conductive metal comprises an electroplating method.

10. The method of claim 1, wherein the step of forming the electrically connecting components further comprises:

forming a plurality of trenches in the encapsulant, wherein the trenches are located above the active surface of the sensor chip and extend to the bonding pads of the sensor chip; and forming an electrically conductive metal in the trenches.

11. The method of claim 10, wherein the step of forming the electrically conductive metal comprises an electroplating method.

12. The method of claim 1, wherein there is a chamfered corner formed on the periphery of the active surface of the sensor chip.

13. The method of claim 1, wherein the chip sensor is monolithically formed in a wafer before the chip sensor is attached to the temporary carrier.

14. The method of claim 13, further comprising:

performing a wafer-cutting step for separating the chip sensor individually.

* * * * *